United States Patent
Chadha

(10) Patent No.: US 10,110,182 B2
(45) Date of Patent: Oct. 23, 2018

(54) ESTIMATING VOLTAGE ON SPEAKER TERMINALS DRIVEN BY A CLASS-D AMPLIFIER

(71) Applicant: TEXAS INSTRUMENTS INCORPORATED, Dallas, TX (US)

(72) Inventor: Jasjot Singh Chadha, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/382,159

(22) Filed: Dec. 16, 2016

(65) Prior Publication Data

US 2017/0272045 A1 Sep. 21, 2017

(30) Foreign Application Priority Data

Dec. 15, 2015 (IN) ............... 6712/CHE/2015

(51) Int. Cl.
*H04R 29/00* (2006.01)
*H03F 3/217* (2006.01)
(Continued)

(52) U.S. Cl.
CPC .......... *H03F 3/2173* (2013.01); *H03F 3/183* (2013.01); *H04R 3/04* (2013.01); *H04R 29/001* (2013.01); *H03F 2200/03* (2013.01); *H03F 2200/331* (2013.01); *H03F 2200/351* (2013.01); *H03M 3/50* (2013.01); *H04R 3/002* (2013.01)

(58) Field of Classification Search
CPC .... H03F 3/2173; H03F 3/183; H03F 2200/03; H03F 2200/351; H03F 99/00; H03F 3/00; H03F 3/68; H03F 3/217; H03F 3/2171; H03F 3/45; H03F 1/3211; H03F 2200/432; G11C 27/02; H03M 3/464; H04R 3/04; H04R 29/001; H04R 29/00; H04R 29/002; H04R 29/003; H04R 29/007; H04R 29/008; H04R 25/30; H04R 2430/01; H04R 3/00; H04R 3/002; H04R 3/007; H04R 3/02; H04R 3/06; H04R 3/08; H04R 19/013; H04R 19/02; H04R 11/00; H04R 11/02; H04R 9/00; H03G 7/00; H03G 5/00; H03G 5/025; H03G 5/005; H03G 3/20; H03G 3/32; H03G 3/3005; H03G 3/3021;
(Continued)

(56) References Cited

U.S. PATENT DOCUMENTS

| 4,947,133 A * | 8/1990 | Thomas ............. H03G 7/002 327/100 |
| 2005/0083114 A1* | 4/2005 | Risbo .............. H03F 3/217 330/10 |
| 2013/0223652 A1* | 8/2013 | Sahandiesfanjani ...... H03F 1/30 381/121 |

* cited by examiner

*Primary Examiner* — Leshui Zhang
(74) *Attorney, Agent, or Firm* — John R. Pessetto; Charles A. Brill; Frank D. Cimino

(57) ABSTRACT

A system includes an audio amplifier, a duty cycle detector, a channel equalizer, and a sample-and-hold circuit. The audio amplifier is configured to amplify an analog audio signal to produce an amplified audio signal. The duty cycle detector is configured to generate a saturation detect signal at a first state upon detection that the amplified audio signal produced by the audio amplifier is clipped. The channel equalizer is configured to generate an initial estimate of a speaker terminal voltage. The sample-and-hold circuit is configured to sample and hold the initial estimate of the speaker terminal voltage as a final estimate of the speaker voltage when the saturation detect signal is in the first state.

13 Claims, 5 Drawing Sheets

(51) Int. Cl.
*H03F 3/183* (2006.01)
*H04R 3/04* (2006.01)
*H04R 3/00* (2006.01)
*H03M 3/00* (2006.01)

(58) Field of Classification Search
CPC .. H03G 3/3026; H03G 3/3031; H03G 3/3089; H04B 1/64
USPC .... 381/7, 28, 55, 57, 58, 59, 104, 106, 120, 381/121, 123, 321, 82, 83, 84, 85, 96, 381/102, 103, 108, 107, 111, 116, 117, 381/92; 330/251, 297, 86, 10, 207 A, 330/207 P; 700/94
See application file for complete search history.

ESTIMATING VOLTAGE ON SPEAKER TERMINALS DRIVEN BY A CLASS-D AMPLIFIER

CROSS-REFERENCE TO RELATED APPLICATIONS

The present application claims priority to Indian Provisional Patent Application No. 6712/CHE/2015, filed Dec. 15, 2015, titled "Predicting Accurate Voltage On A Speaker Terminals In Digital Input Class-D Amplifier," which is hereby incorporated herein by reference in its entirety.

BACKGROUND

Some electronic devices such as smart phones include speakers. The electronic device includes an audio amplifier and other electronics that generate electrical signals to be provided to the speaker for conversion to audio. The audio amplifier is a power amplifier that amplifies low-power audio signals (e.g., signals comprising primarily frequencies between 20 Hz and 20 KHz) to a level suitable for driving a speaker. Audio amplifiers may be employed in the final stage of an audio playback chain to amplify audio signals for playback on a speaker which may comprise a headset or a speaker in a mobile device such as smart phone. Audio amplifiers may be implemented using class-D amplifiers, class AB amplifiers, and the like.

In some implementations, the voltage and/or current to the speaker is sensed, rescaled, and digitized as a feedback signal. The speaker voltage/current signals may be used to compute, for example, the speaker's coil temperature and excursion.

SUMMARY

In some embodiments, system may include an interpolator, a delta-sigma modulator, a digital-analog converter (DAC), a class-D amplifier, a duty cycle detector, and a channel equalizer. The delta-sigma modulator is configured to encode an analog signal into a digital stream. The DAC is configured to convert the digital stream to a DAC analog output signal. The class-D amplifier is configured to amplify the DAC analog output signal to drive a speaker. The duty cycle detector is configured to detect whether the analog output signal from the class-D amplifier has saturated and to generate a saturation detect signal at a first state upon detecting that the class-D amplifier has saturated and at a second state when upon detecting that that class-D amplifier has not saturated. The channel equalizer is configured to generate an initial estimate of the speaker voltage. The sample and hold circuit is configured to generate as a present estimate of the speaker voltage the initial estimate when the class-D amplifier has saturated. When the class-D amplifier is not saturated, the sample and hold circuit generates a current estimate of the speaker voltage.

In other embodiments, a system includes an audio amplifier, a duty cycle detector, a channel equalizer, and a sample-and-hold circuit. The audio amplifier is configured to amplify an analog audio signal to produce an amplified audio signal. The duty cycle detector is configured to generate a saturation detect signal at a first state upon detection that the amplified audio signal produced by the audio amplifier is clipped. The channel equalizer is configured to generate an initial estimate of a speaker terminal voltage. The sample-and-hold circuit is configured to sample and hold the initial estimate of the speaker terminal voltage as a final estimate of the speaker voltage when the saturation detect signal is in the first state.

In yet another embodiment, a system includes an interpolator, a delta-sigma modulator, a DAC, a class-D amplifier, a duty cycle detector, digital pulse width modulation (PWM) converter, and a digital PWM saturation component. The delta-sigma modulator is coupled to the interpolator and is configured to encode an analog signal into a digital stream. The DAC is coupled to the delta-sigma modulator and is configured to convert the digital stream to a DAC analog output signal The class-D amplifier is coupled to the DAC and is configured to amplify the DAC analog output signal to drive a speaker. The duty cycle detector is coupled to the class-D amplifier and is configured to detect whether the analog output signal from the class-D amplifier has saturated and to generate a saturation detect signal at a first state upon detecting that the class-D amplifier has saturated and at a second state when upon detecting that that class-D amplifier has not saturated. The digital PWM converter is configured to produce a PWM waveform from an output signal from the delta-sigma modulator. The digital PWM saturation component is coupled to the digital PWM converter and is configured to extend the PWM waveform to a 100% duty cycle upon receipt of the saturation detect signal at the first state to produce an PWM extended signal.

Another embodiment is directed to a method that may include generating an audio input signal, amplifying the audio input signal, generating an initial estimate of an audio speaker voltage using the audio input signal, determining that an amplifier has saturated, and sampling and holding the initial estimate as a final estimate of the audio speaker voltage.

BRIEF DESCRIPTION OF THE DRAWINGS

For a detailed description of various examples, reference will now be made to the accompanying drawings in which.

DETAILED DESCRIPTION

This disclosure is directed to an audio system containing an amplifier for driving a speaker. The audio system receives digital audio values, converts the digital values to analog audio, and amplifies the analog audio. The disclosed audio system estimates the speaker's voltage e.g., voltage across the speaker's terminals), rather than directly measuring the voltage. The estimate of voltage is based on the input digital audio values to the audio system. The audio system includes an amplifier and a duty cycle detector that determines when the voltage produced by the amplifier has "clipped." That is, the duty cycle detector determines when the amplifier's output has reached its maximum voltage level as dictated by the power supply voltage. The duty cycle detector then generates a signal that is provided to a sample-and-hold circuit that causes a previously estimated speaker voltage to be held and used as the estimated speaker voltage until the clipping state is no longer detected by the duty cycle detector. The disclosed audio system thus uses the digital input values to estimate the speaker voltage and adjusts the estimate based on whether the audio amplifier has clipped. As a result, the estimated speaker voltage and current is more accurate than would be the case if amplifier clipping was not taken into account. Further, because voltage is estimated instead of measured, a voltage measurement channel to provide a voltage measurement value from the speaker is not needed and thus need not be included in the system.

Figure 1:
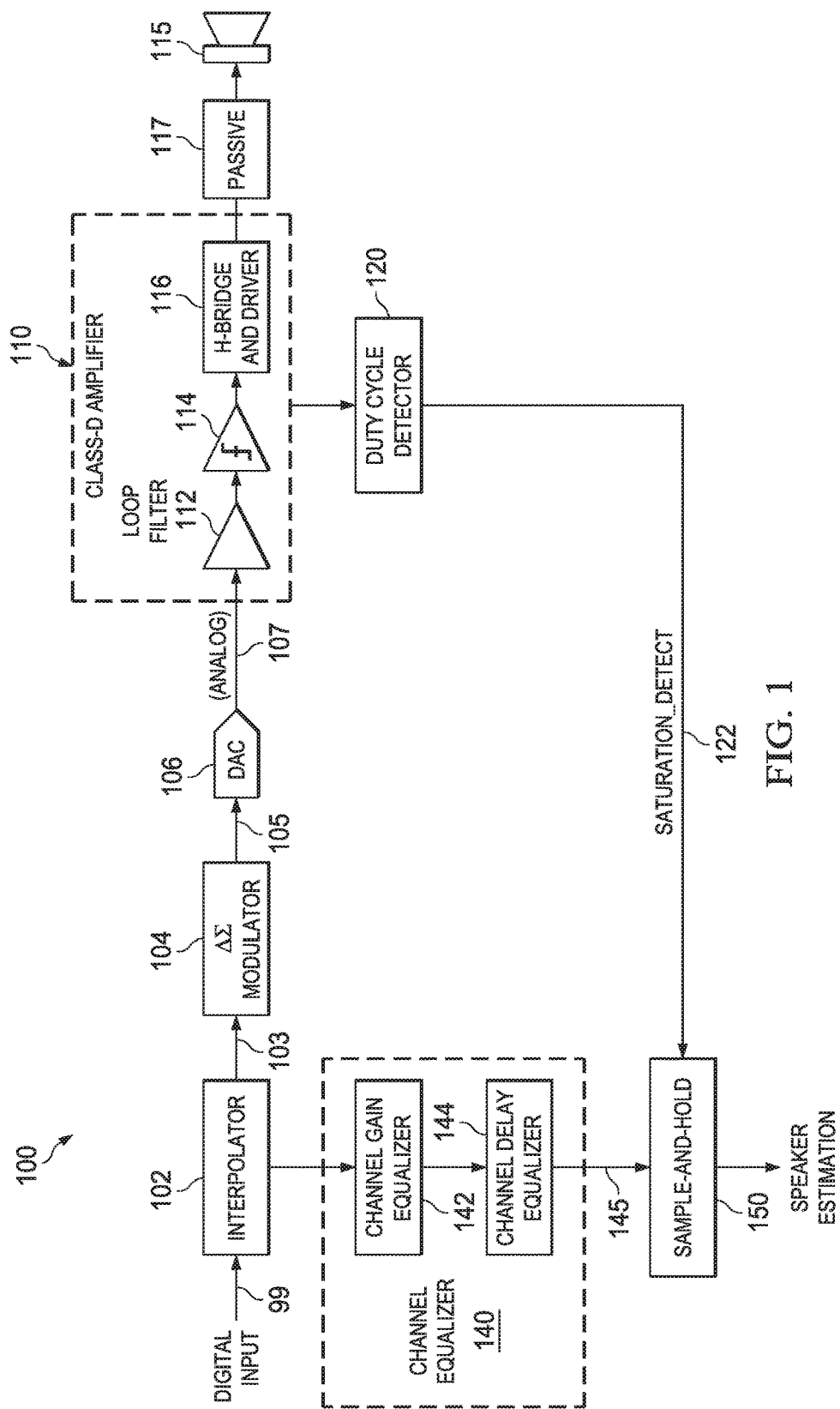
FIG. 1 shows an audio system including an audio amplifier, a duty cycle detector, and as sample and hold circuit in accordance with various examples.

FIG. 1 shows an example of an audio system 100. Digital input 99 is provided to the audio system 100 and ultimately converted to an analog signal 107 by digital-to-analog converter (DAC) 106, amplified by an audio amplifier 110 (which may be a class-D amplifier and referred to herein as class-D amplifier 110), and the amplified analog signal is used to drive a speaker 115. One or more passive components 117 (e.g., electromagnetic interference (EMI) filtering ferrite beads) also may be included. The speaker 115 may be standalone speaker, a speaker integrated into an electrical device such as smart phone, tablet device, personal computer, etc. The audio system 100 with speaker 115 thus may be part of one device or the speaker may be separate from the rest of the electronics shown in FIG. 1.

As shown, the audio system 100 includes an interpolator 102, a delta-sigma (ΔΣ) modulator 104, the DAC 106, the class-D amplifier 110, a duty cycle detector 120, a channel equalizer 140, and a sample-and-hold circuit 150. The speaker 115 may be part of the audio system or separate as note above. These components (other than speaker 115) may be implemented as discrete circuits provided on a common die, separate dies, a common circuit board, separate circuit boards, etc.

The interpolator 102 generally upsamples the digital input 99. For example, the interpolator 102 may receive a lower sampling frequency signal such as 48 ksps (kilo samples per second), and increases its sampling frequency rate to a larger frequencies (e.g., 3.072 msps) without degrading the noise levels of the original input signal. The resulting data is shown in FIG. 1 as interpolated digital values 103. The delta sigma modulator 104 converts the interpolated digital values to a lower level digital bit stream 105. For example, the interpolated digital values may comprise 16 bits and the lower level digital bit stream 105 may comprise 2 or 4 (or other) bits. The lower level digital bit stream 105 is then converted to an analog signal by DAC 106 to produce the analog signal 107.

The analog signal 107 is then amplified by the class-D amplifier 110. The class-D amplifier 110 includes a loop filter 112, a comparator 114, and an H-bridge and driver 116 coupled together as shown in FIG. 1. The comparator compares the loop filter's output to a ramp waveform (as will be discussed below) and the comparator's output is provided to the H-bridge and driver 116 which may comprise a pair of transistors which operate as switches. The transistors reciprocally switch rapidly back and forth between fully conductive and nonconductive states. The comparator's output signal causes the switches to switch state, the result of which is an amplified output pulse train which then may be filtered by a passive low-pass filter to produce the audio signal to be provided to the speaker.

The channel equalizer includes a channel gain equalizer 142 and a channel delay equalizer 144. The channel gain equalizer 142 receives digital values from the interpolator and equalizes the digital values based on the collective gain of the delta-sigma modulator 104, the DAC 106, the class-D amplifier 110, and any passive components 117. The channel gain equalizer thus mimics the gain these components contribute to the audio signal. The delta-sigma modulator 104, DAC 106, and class-D amplifier 110 also may cause a certain amount of delay to be added to the digital input values 99. The channel delay equalizer 144 mimics that amount of delay. The output 145 of the channel equalizer thus comprises digital values that mimic the gain and delay introduced by the rest of the audio system including any external passive component's delay and gain, and thus the output 145 represents an estimate of the speaker voltage and current.

As noted above, the analog signal 107 provided to the input of the class-D amplifier may be high enough relative to the supply voltage to the amplifier that, when amplified, the output of the class-D amplifier may be clipped. As a result, the amplifier's output voltage will not be as high as the voltage would have been absent the clipping. Consequently, the speaker voltage estimate produced by the channel equalizer 140 may be higher than the speaker voltage actually is.

The duty cycle detector 120 detects this condition (clipped amplifier output voltage) and asserts a SATURATION_DETECT signal 122 to the sample-and-hold circuit 150. The SATURATION_DETECT 122 signal indicates whether the amplifier has saturated. If the amplifier has saturated, the SATURATION_DETECT signal causes the sample-and-hold circuit 150 to sample and hold the last state of the output 145 of the channel equalizer 140 as the speaker voltage estimate. Thus, even though the channel equalizer may continue to estimate a higher speaker voltage, the sample-and-hold circuit 150 maintains the estimate at a constant level commensurate with the saturation of the amplifier.

The speaker voltage estimate and other information (e.g., the input signal 99) may be used to compute various parameters about the audio system, such as speaker coil temperature. The speaker voltage estimate may be provided to a circuit (not shown) such as a processor that controls the audio signal to the audio system. For example, if the speaker coil is estimated to be becoming too hot, the magnitude of the audio signal may be reduced.

Figure 2:
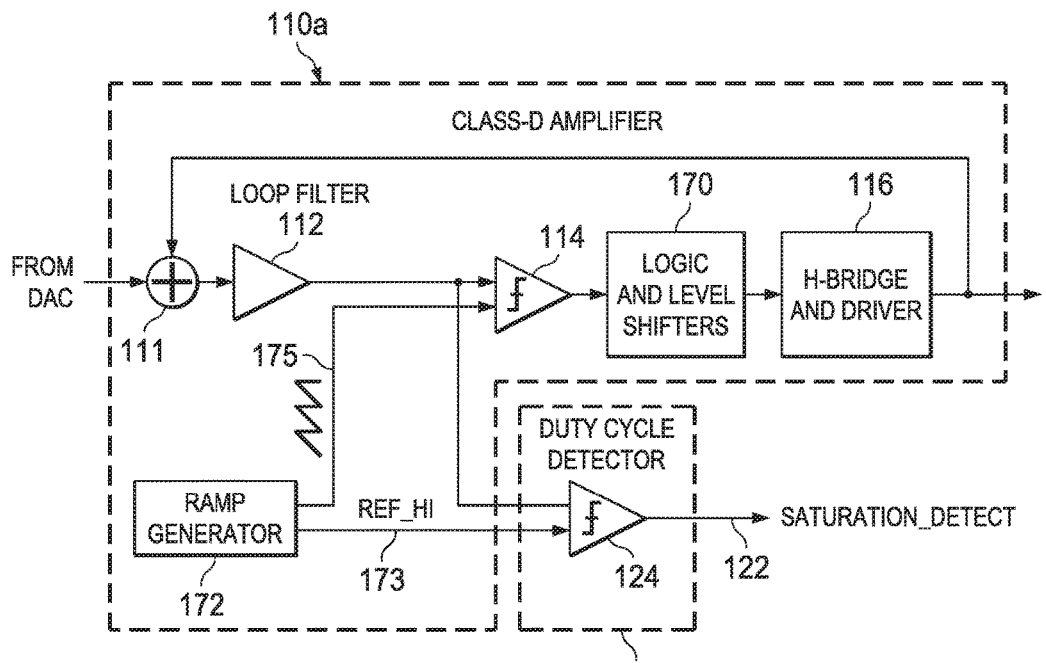
FIG. 2 illustrates an example of the audio amplifier and the duty cycle detector.

FIG. 2 illustrates an example of the class-D amplifier and the duty cycle detector—illustrated in FIG. 2 as class-D amplifier 110a and duty cycle detector 120a. The input to the class-D amplifier 110a is from the DAC as shown and the output signal from the duty cycle detector 120a is the SATURATION_DETECT signal 122. The class-D amplifier 110a includes an adder 111, the loop filter 112, the comparator 114, logic and level shifters 170, the H-bridge and driver 116, and a ramp generator 172. The ramp generator generates a saw-tooth waveform 175 which is then compared to the loop filter's output 113 by the comparator 114. The comparator's output signal will be high when the loop filter's output exceeds the saw tooth waveform and low otherwise. The output of the comparator 114 is then converted into an input bit-stream for controlling the H-bridge and driver 116 by the logic and level shifters 170. The logic and level shifters 170 change the voltage domain of the signal at its input to voltage compatible with the speaker. Also the logic and level shifters 170 can optionally increase the duration or filter out narrow pulse width signals to make the H-bridge and driver 116 work reliably. As shown, the output of the H-bridge and river 116 is then fed back to the input of the class-D Amplifier 110a, where it is subtracted from the input signal by the adder 111 to generate an error signal passing through the loop filter 112, which filters the non-essential frequency signals (e.g., signals greater than 20 kHz) and amplifies the signals in the signal bandwidth (e.g., 20 Hz to 20 kHz).

The ramp generator 172 generates a REF_HI signal 173 which is a constant voltage level that is higher than the maximum voltage of the ramp waveform 175. The ramp waveform 175 generally represents the full voltage swing of the supply voltage for the amplifier. The REF_HI signal 173 is configured to be set slightly higher than the maximum saw-tooth waveform voltage, for example, 50 mV to 200 mV higher. The duty cycle detector 120a includes a comparator 124 which compares the REF_HI signal 173 to the loop filter's output. If the loop filter's output 113 is less than REF_HI 173, then the comparator forces SATURATION_DETECT 122 to a second state (e.g., logic low). However, if the loop filter's output 113 is greater than REF_HI 173, then the comparator forces SATURATION_DETECT 122 to a first state (e.g., logic high). The first state for SATURATION_DETECT 122 is indicative of the amplifier being saturated and its output voltage being clipped.

Figure 3:
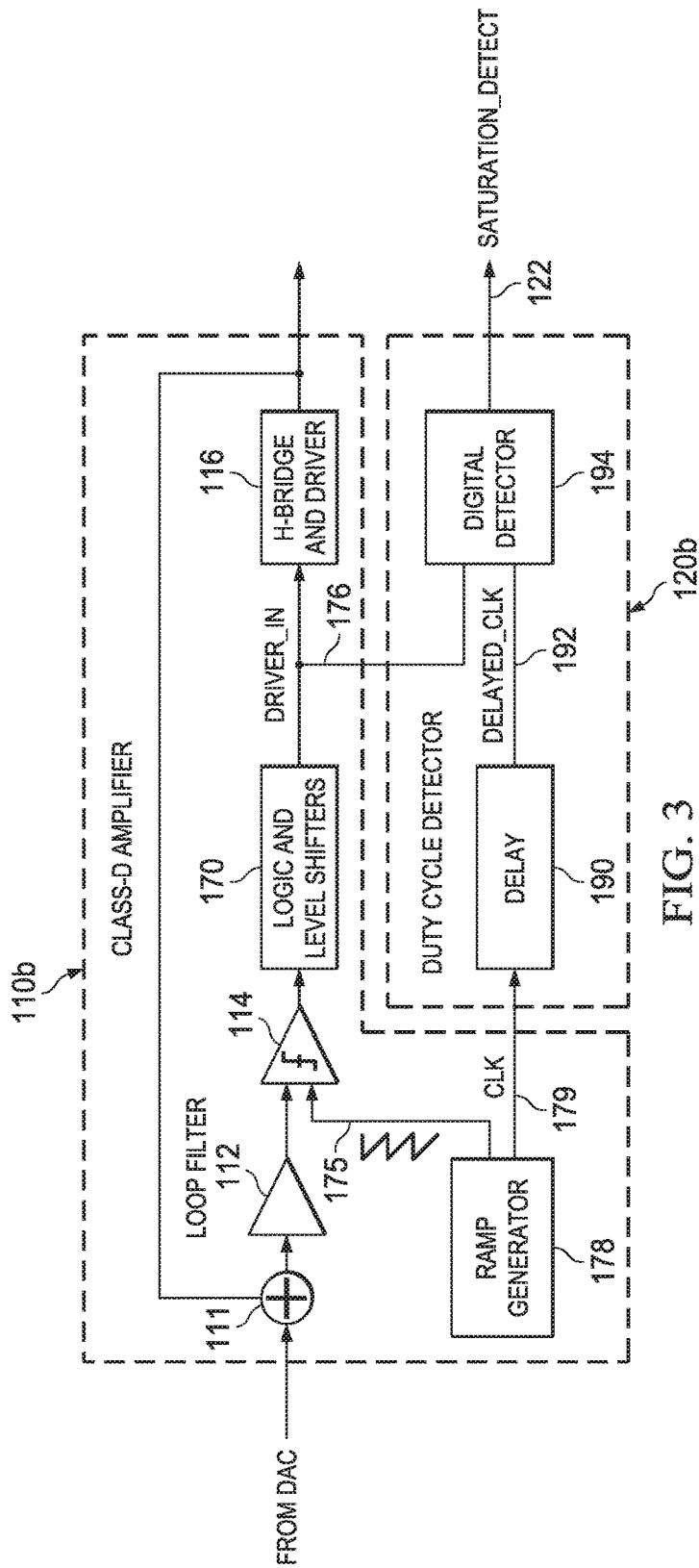
FIG. 3 shows an example of the system with another embodiment of the duty cycle detector.

FIG. 3 illustrates another example of the class-D amplifier and the duty cycle detector—illustrated in FIG. 3 as class-D amplifier 110b and duty cycle detector 120b. The architecture of class-D amplifier 110b is similar to class-D amplifier 110a as described above. A difference is that the class-D amplifier 110b includes ramp generator 178 that, in addition to the saw tooth waveform 175, generates a clock signal (CLK) 179. The clock signal 179 is a clock signal whose period and phase matches that of the saw-tooth waveform 175.

The duty cycle detector 120b of FIG. 3 includes a delay 190 coupled to a digital detector 194. The delay 190 introduces a time delay to the CLK signal 179 to produce a delayed clock (DELAYED_CLK) 192. The time delay of delay 190 approximately matches the collective delay of comparator 114, logic 170 and a minimum duty cycle of the saw-tooth waveform 175. The digital detector 194 receives a DRIVER_IN signal 176 from the logic and level shifters 170. The DRIVER_IN signal 176 is similar to the comparator output signal, but with small pulse width signals having been filtered out. The digital detector 194 determines when the DRIVER_IN is high at consecutive edges of the delayed clock (DELAYED_CLK) signal 192. For example, the digital detector 194 may detect that DRIVER_IN is high at a rising edge of DELAYED_CLK followed by an immediately subsequent falling edge, or at a falling edge of DELAYED_CLK followed by a rising edge. If the DRIVER_IN signal is high for both edges of DELAYED_CLK 192, then the loop is experiencing a 100% duty cycle and the digital detector 194 asserts the SATURATION_DETECT signal 122 to a logic high state.

Figure 4:
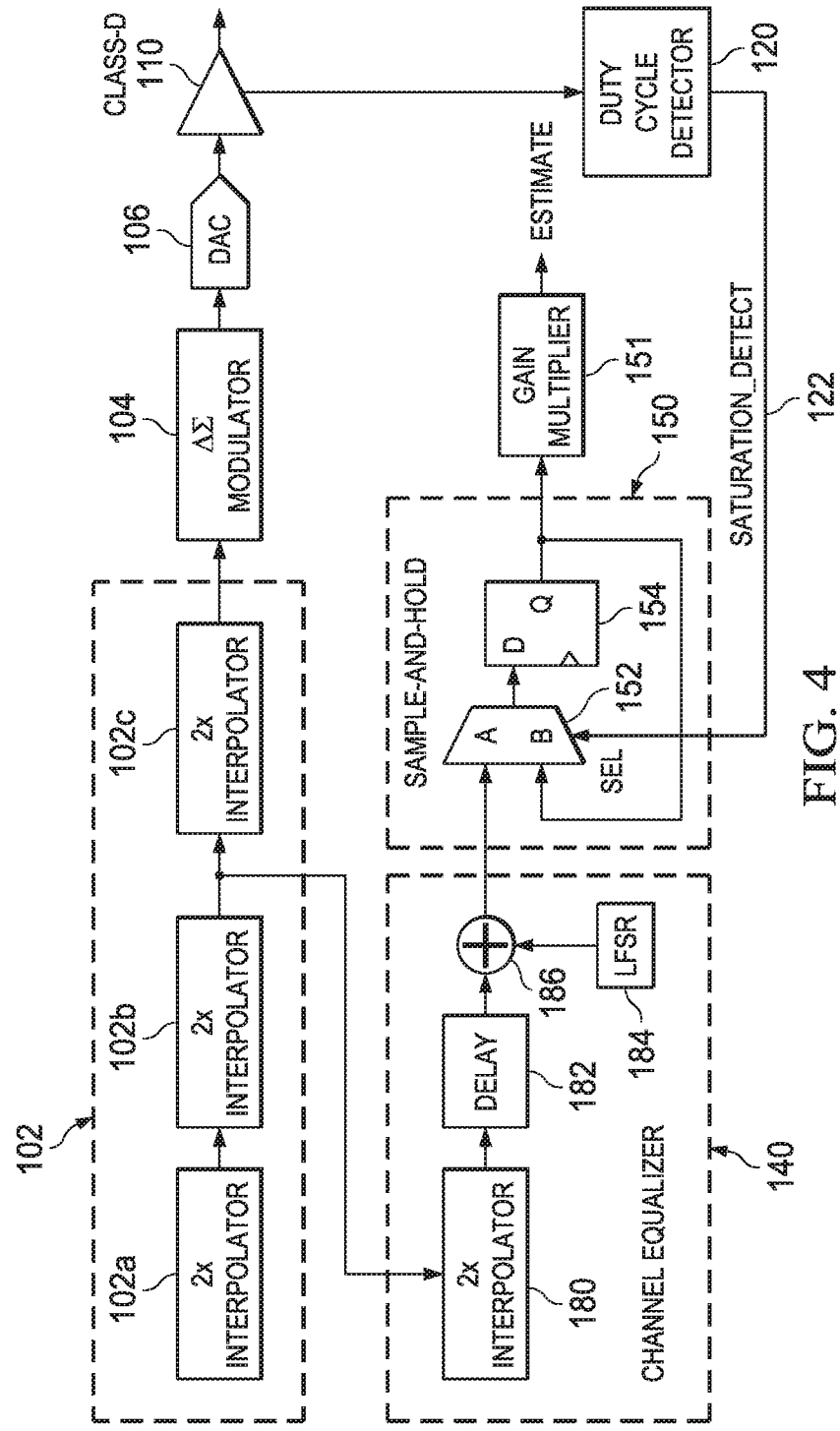
FIG. 4 shows an example of the system with an embodiment of the sample and hold and channel equalization circuits in accordance with various examples.

FIG. 4 shows an example of the audio system with emphasis on the interpolator 102, channel equalizer 140, and sample-and-hold circuit 150. The interpolator 102 in this example comprises a three-stage interpolator including a first-stage interpolator 102a, a second-stage interpolator 102b, and a third-stage interpolator 102c. Each interpolator in this example converts the sampling clock rate of input stream by a factor of 2 without degrading the noise performance of the input signal. This upsampling increases the time resolution of the input signal and as well as the accuracy of the comparison and sample and hold process. Other embodiments may include additional interpolators besides the three shown in the example of FIG. 4, or the interpolation factor can be increased from 2× to higher rates such as 4×, 8×, etc. to increase the time resolution further for more accuracy. The channel equalizer 140 includes an interpolator 180, which replicates the third-stage interpolator 102c. The channel equalizer 140 of FIG. 4 also includes a delay 182, a linear feedback shift register 184, and an adder 186. The delay 182 receives the higher sampling frequency signal from the replicated final stage of interpolator 102c (i.e., replicated via interpolator 180, and delays that signal by a time period that is configured to approximate the collective delay of the audio channel (e.g., the delta-sigma modulator 104, the DAC 106, and the class-D amplifier 110) to thereby synchronize the data to the clipping detection data. Dither then may be added to the estimate to replicate the noise in the analog channel. The dither is generated by the linear feedback shift register and added to the estimate by way of the adder 186.

The sample-and-hold circuit 150 includes a multiplexer 152 coupled to a flip-flop 154. The multiplexer 152 in this example includes two inputs—an A input and a B input as shown. The summed signal from the adder 186 of the channel equalizer 140 is provided to the A input. The B input of the multiplexer 152 is coupled to the output of flip-flop 154 of the sample and hold circuit. The multiplexer 152 also includes a select input (SEL) that is coupled to the SATURATION_DETECT signal 122 from the duty cycle detector. The SATURATION_DETECT signal 122 thus causes the multiplexer 150 to sample and hold its output signal which, other than the gain factor provided by the gain multiplier 151 noted below, represents a final estimate of the speaker voltage when the SATURATION_DETECT signal 122 is at a state indicative of the amplifier 110 being in a saturated state. Otherwise, the SATURATION_DETECT signal 122 causes the final estimate from the flip-flop 154 to track the estimate generated from the channel equalizer 140 (i.e., the summed signal from the adder 186). The output from flip-flop 154 is then amplified by the gain multiplier stage 151 configured to replicate the gain of the audio channel. The output of the gain multiplier stage represents the final estimate of the speaker voltage.

Figure 5:
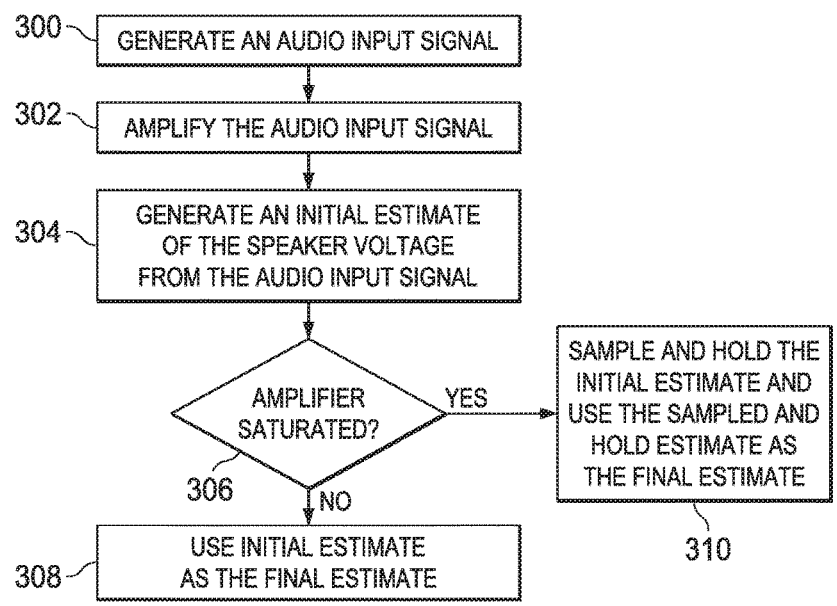
FIG. 5 shows a method in accordance with various embodiments.

FIG. 5 shows a method in accordance with various embodiments. At 300, the method includes generating an audio input signal. The audio input signal may comprise a digital audio signal as noted above, which then may be converted to an analog signal before being amplified. Alternatively, the audio input signal may comprise an analog signal from the outset. The audio input signal may be generated by a processor on an electronic device such as a smart phone, tablet device, computer, etc. and may comprise, for example, a playback signal for playing a recorded audio file, streamed audio data (e.g., a music, podcast, etc.).

At 302, the method includes amplifying the audio input signal. This operation uses an audio amplifier. Of course, if the audio input signal is a digital signal, a delta-sigma modulator and a digital-to-analog converter may be used to convert the digital signal to an analog form before the amplification process. The amplified audio input signal may be used to drive a speaker.

At 304, the method includes generating an initial estimate of the speaker voltage from the audio input signal. In embodiments in which the audio input signal is a digital signal, the initial estimate is generated by modifying the audio input signal based on the predetermined gain and delay of the analog channel of the delta-sigma modulator, digital-to-analog converter, amplifier, external passive components (e.g., ferrite bead filters).

At 306, the method includes determining whether the amplifier has saturated, that is, whether the output signal from the amplifier has clipped due to amplifier attempting generate an output signal to the speaker that would otherwise exceed the supply voltage for the amplifier. This operation can be performed in a variety of ways such as through the use of the circuits described above. If the amplifier is not saturated (as determined at 306), then at 308, the method includes tracking and using the initial estimate as the final estimate of the speaker voltage. If, however, the amplifier is saturated, then at 310, the initial estimate determined at the point that the amplifier was determined to be saturated is sampled, held and used as the final estimate.

Figure 6:
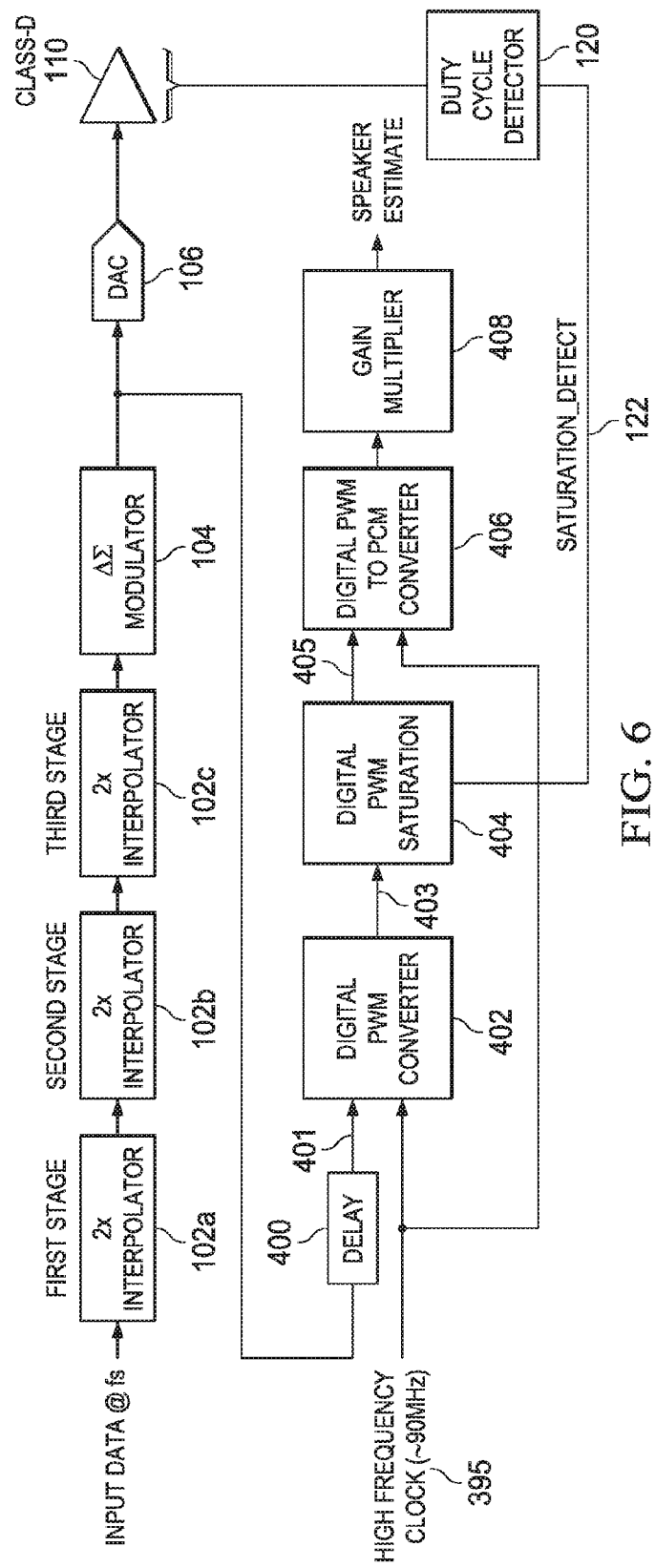
FIG. 6 shows an alternative embodiment of an audio system.

FIG. 6 illustrates another embodiment of an audio system. In the embodiment of FIG. 6, the audio system includes the three-stage interpolators 102*a*, 102*b*, and 102*c* (although a different number of stages of interpolators is possible, as well as a different upsampling factor besides 2), the delta-sigma modulator 104, the DAC 106, the class-D amplifier 110, and the duty cycle detector 120 as described above. The audio system in this example also includes a delay 400, a digital pulse width modulation (PWM) converter 402, a digital PWM saturation component 404, a digital PWM to pulse code modulation (PCM) converter 406, and a gain multiplier 408.

The interpolated and sigma delta modulated data (i.e., the output of the delta-sigma modulator 104) is delayed by the delay 400 to produce a delay signal 401. This delay data is then converted to a PWM waveform 403 using a digital ramp signal generated from a high frequency clock 395 (e.g., a 90 MHz clock). The frequency of the clock 395 may depend upon the desired level of accuracy.

To replicate the sample and hold effect discussed above, the digital PWM waveform 403 can be extended to 100% duty cycle (and hence saturated/clipped) waveform by the digital PWM saturation component 404 whenever the SATURATION_DETECT signal 122 becomes high. The output PWM waveform 405 from the digital PWM saturation component 404 can then be converted back to the required digital stream (e.g., the PCM format) by the digital PWM to PCM converter 406 and then gain adjusted by the gain multiplier 408 to replicate the gain in the remaining channel (e.g., the delta-sigma modulator 104, DAC 106, amplifier 110, and external passive components noted above). The architecture of FIG. 6 may result in increased accuracy in terms of performing the saturation because the saturation process is performed in a PWM waveform and is a more accurate representation of what is happening in the analog class-D loop associated with the amplifier 110. So the voltage estimation represented by the resulting speaker estimation signal may depict the actual clipping waveform at the output more accurately.

Certain terms may have been used throughout this description and claims to refer to particular system components. This document does not intend to distinguish between components that differ in name but not function. In the description and claims, the terms "including" and "comprising" are used in an open-ended fashion, and thus should be interpreted to mean "including, but not limited to . . . ." Also, the term "couple" or "couples" is intended to mean either an indirect or direct wired or wireless connection.

Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system for reducing saturation in an amplifier, comprising:
    an interpolator to receive an input digital audio signal;
    a delta-sigma modulator coupled to the interpolator to receive the interpolated digital audio signal and output a digital stream;
    a digital-analog converter (DAC) coupled to the delta-sigma modulator and configured to convert the digital stream to an analog output signal;
    a class-D amplifier as the amplifier is coupled to the DAC and configured to amplify the analog output signal to generate a speaker voltage to drive a speaker;
    a duty cycle detector coupled to an output of the class-D amplifier and configured to detect whether the analog output signal from the class-D amplifier has saturated and to generate a saturation detect signal in response when the analog output signal from the class-D amplifier is detected and saturated by the duty cycle detector;
    a channel equalizer coupled to the interpolator and configured to generate estimates of the speaker voltage; and
    a sample and hold circuit coupled to an output of the duty cycle detector and an output of the channel equalizer and configured to maintain a present estimate value of the estimates of the speaker voltage when receiving the generated saturation detect signal and allow the estimates of the speaker voltage to change with the digital audio signal when the class-D amplifier is detected and not saturated by the duty cycle detector;
    wherein saturation of the class-D amplifier is reduced.

2. The system of claim 1, wherein the sample and hold circuit includes a multiplexer coupled to a flip flop, wherein the multiplexer includes an A input and a B input, wherein the A input is coupled to an output of the channel equalizer and the B input is coupled to an output of the sample and hold circuit, and wherein the multiplexer includes a select input that is coupled to the generated saturation detect signal from the duty cycle detector.

3. The system of claim 2, wherein the channel equalizer includes:
    an interpolator configured to upsample the interpolated digital audio signal to thereby generate a higher sampling frequency signal;
    a delay coupled to the interpolator of the channel equalizer and configured to delay the higher sampling frequency signal to thereby generate a delay signal;
    a linear feedback shift register; and
    an adder coupled to the delay and the linear feedback shift register, wherein the adder is configured to add a signal from the linear feedback shift register to the delay signal from the delay to thereby generate a summed signal and provide the summed signal to the A input of the multiplexer.

4. The system of claim 1, wherein:
    the class-D amplifier includes a loop filter, a ramp generator, and a first comparator coupled to the loop filter and the ramp generator; and
    the duty cycle detector includes a second comparator coupled to the ramp generator and the loop filter, wherein the duty cycle detector is configured to generate the saturation detect signal based on a comparison of an output signal from the loop filter to a reference voltage generated by the ramp generator that is configured to be a voltage that is higher than a maximum voltage of a saw tooth waveform generated by the ramp generator.

5. A system comprising:

an interpolator to receive an input audio signal and output an analog audio signal;

an audio amplifier i& coupled to the interpolator and configured to amplify the analog audio signal to produce an amplified audio signal as a speaker voltage to drive a speaker;

a duty cycle detector coupled to an output of the audio amplifier and configured to detect whether the amplified audio signal has saturated and to generate a saturation detect signal in response when the amplified audio signal is detected and saturated by the duty cycle detector;

a channel equalizer coupled to the interpolator to receive the analog audio signal and configured to generate estimates of the speaker voltage; and a sample and hold circuit coupled to an output of the duty cycle detector and an output of the channel equalizer and configured to maintain a present estimate value of the estimates of the speaker voltage when receiving the saturation detect signal and allow the estimates of the speaker voltage to change with the input audio signal when the amplified audio signal is detected and is not saturated by the duty cycle detector for reducing saturation in the audio amplifier.

6. The system of claim 5, wherein the audio amplifier is a class-D amplifier.

7. The system of claim 5, wherein:

the audio amplifier includes a loop filter, a ramp generator, and a first comparator coupled to the loop filter and the ramp generator; and the duty cycle detector includes a second comparator coupled to the ramp generator and the loop filter, wherein the duty cycle detector is configured to generate the saturation detect signal based on a comparison of an output signal from the loop filter to a reference voltage generated by the ramp generator that is configured to be a voltage that is higher than a maximum voltage of a saw tooth waveform generated by the ramp generator.

8. The system of claim 5, wherein:

the audio amplifier includes a loop filter, a ramp generator, a comparator coupled to the loop filter and the ramp generator, a minimum duty cycle detector coupled to the comparator, and a driver coupled to the minimum duty cycle detector; and the duty cycle detector includes:

a delay circuit coupled to the ramp generator and configured to delay a clock signal generated by the ramp generator to generate a delayed clock signal;

a digital detection circuit coupled to the delay circuit and to the minimum duty cycle circuit, wherein the digital detection circuit is configured to generate the saturation detect signal at the first state upon detection that a drive signal from the minimum duty cycle detector to the driver is at a logic high state at adjacent rising edges or adjacent falling edges of the delayed clock signal from the ramp generator.

9. A method for reducing saturation in an audio amplifier, comprising:

generating an audio input signal;

amplifying the audio input signal by the audio amplifier to produce an amplified audio signal as an audio speaker voltage to drive a speaker;

generating estimates of the audio speaker voltage using the audio input signal applied to an equalizer with no amplifying of the audio input signal by the audio amplifier;

detecting that the audio amplifier has saturated to generate a saturation detect signal in response when the amplified audio signal is detected and saturated; and sampling and maintaining a present estimate value of the estimates of the audio speaker voltage when receiving the saturation detect signal and allowing the estimates of the audio speaker voltage to change with the audio input signal when the audio amplifier is detected and not saturated.

10. The method of claim 9, wherein generating initial estimates of the audio speaker voltage includes:

equalizing by the equalizer digital values from an interpolator based on the collective gain of components including a delta-sigma modulator, a digital-to-analog converter, a class-D amplifier, and passive components coupled to the speaker; and replicating an amount of time delay introduced by at least the delta-sigma modulator, the digital-to-analog converter, and the class-D amplifier.

11. The method of claim 9, wherein the detecting when the audio amplifier is saturated includes comparing a reference signal to an output of a loop filter of the audio amplifier.

12. The method of claim 9, wherein detecting when the audio amplifier has saturated includes:

delaying a clock signal of a ramp generator to produce a delayed clock; and detecting that a signal to drive an H-bridge and driver of the audio amplifier is at a high logic state at consecutive edges of the delayed clock.

13. The method of claim 9, wherein the audio amplifier is a class-D amplifier.

* * * * *